(12) United States Patent
Li et al.

(10) Patent No.: US 10,504,941 B2
(45) Date of Patent: Dec. 10, 2019

(54) PREPARATION METHOD FOR ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Liangliang Li, Beijing (CN); Huibin Guo, Beijing (CN); Shoukun Wang, Beijing (CN); Yuchun Feng, Beijing (CN); Yao Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 150 days.

(21) Appl. No.: 15/657,413

(22) Filed: Jul. 24, 2017

(65) Prior Publication Data

US 2018/0026056 A1 Jan. 25, 2018

(30) Foreign Application Priority Data

Jul. 25, 2016 (CN) .......................... 2016 1 0591620

(51) Int. Cl.
*H01L 21/00* (2006.01)
*H01L 27/12* (2006.01)
(Continued)

(52) U.S. Cl.
CPC .... *H01L 27/1262* (2013.01); *G02F 1/136286* (2013.01); *H01L 21/0217* (2013.01);
(Continued)

(58) Field of Classification Search
CPC ............. H01L 27/1262; H01L 51/5284; H01L 27/1218; H01L 27/124; H01L 31/02168;
(Continued)

(56) References Cited

U.S. PATENT DOCUMENTS

2001/0019164 A1* 9/2001 Yin ...................... H01L 21/0276
257/437
2002/0105043 A1* 8/2002 Hu .......................... G03F 7/091
257/437

(Continued)

*Primary Examiner* — Shouxiang Hu
(74) *Attorney, Agent, or Firm* — Nath, Goldberg & Meyer; Joshua B. Goldberg

(57) ABSTRACT

The present invention provides an array substrate comprising a substrate, a metal conductive film layer, and an anti-reflective film layer located between the substrate and the metal conductive film layer, and a method for manufacturing the same, as well as a display device. The method comprises step S1: forming an anti-reflective film layer on a substrate by adjusting the reaction power and/or reactive gas flow during the formation of film by the chemical vapor deposition process; and step S2: forming a metal conductive film layer on the substrate finished in step S1. Through the preparation method of the array substrate, the anti-reflective film layer can have a sand-like granulation structure, such that light reflected from the metal conductive film layer can be blocked, thereby weakening or avoiding the light reflected from the surface of the metal conductive film layer, further improving the display effect of the array substrate.

16 Claims, 3 Drawing Sheets

(51) Int. Cl.
*H01L 21/02* (2006.01)
*H01L 21/768* (2006.01)
*G02F 1/1362* (2006.01)
*H01L 51/52* (2006.01)

(52) U.S. Cl.
CPC .. *H01L 21/02123* (2013.01); *H01L 21/02203* (2013.01); *H01L 21/02263* (2013.01); *H01L 21/76829* (2013.01); *H01L 27/124* (2013.01); *H01L 27/1218* (2013.01); *H01L 51/5284* (2013.01); *G02F 2001/13629* (2013.01); *G02F 2001/136295* (2013.01); *G02F 2201/38* (2013.01)

(58) Field of Classification Search
CPC ........... H01L 27/1462; H01L 21/76829; H01L 51/5281; H01L 21/0214; H01L 21/02203; H01L 21/318; H01L 21/0217; H01L 21/02263; G02F 1/136286; G02F 2201/38; G02F 2001/136295; G02F 2001/13629
See application file for complete search history.

(56) References Cited

U.S. PATENT DOCUMENTS

| | | | |
|---|---|---|---|
| 2012/0058307 A1* | 3/2012 | Yun | B05D 5/02 428/143 |
| 2012/0147303 A1* | 6/2012 | Yamada | G02B 1/11 349/96 |
| 2016/0299395 A1* | 10/2016 | Kosuge | G02F 1/136209 |

* cited by examiner

PREPARATION METHOD FOR ARRAY SUBSTRATE

FIELD OF THE INVENTION

The present disclosure relates to the field of display technology, particularly to an array substrate and a method for manufacturing the same, as well as a display device.

BACKGROUND OF THE INVENTION

In the conventional four-sided display panel with narrow borders or no border, the TFT substrate (i.e. the array substrate) is disposed on the viewing side, and the CF substrate (i.e. the color filter substrate) is disposed on the backlight side, therefore such display substrate can greatly narrow the borders on the side laminated with the peripheral printed circuit board.

However, since the array substrate of the above display panel is disposed on the viewing side, the light from outside surroundings would be irradiated directly on the array substrate, bringing forth the reflective phenomenon of metal electrode wire in the array substrate. Especially when the light from outside surroundings is strong, the display effect of screen would be affected severely.

SUMMARY OF THE INVENTION

The present disclosure provides a method for manufacturing an array substrate, comprising:

step S1: forming an anti-reflective film layer on a substrate, wherein the anti-reflective film layer has a sand-like granulation structure by adjusting the reaction power and/or reactive gas flow during the chemical vapor deposition process; and step S2: forming a metal conductive film layer on the anti-reflective film layer.

For example, the step "forming an anti-reflective film layer on a substrate by adjusting the reaction power during the chemical vapor deposition process" includes a first stage and a second stage, in which the first stage and the second stage are carried out continuously, and the reaction power of the first stage is higher than that of the second stage by 50% or more, and alternatively the reaction power of the first stage is lower than that of the second stage by 50% or more.

For example, the step "forming an anti-reflective film layer on a substrate by adjusting the reactive gas flow during the chemical vapor deposition process" includes a first stage and a second stage, in which the first stage and the second stage are carried out continuously, and the reactive gas flow of the first stage is higher than that of the second stage by 20% or more, and alternatively the reactive gas flow of the first stage is lower than that of the second stage by 50% or more.

For example, the first stage is within 1 to 3 seconds from the beginning of the deposition of the anti-reflective film layer.

For example, the anti-reflective film layer comprises a silicon nitride film layer and/or an amorphous silicon film layer.

For example, when forming the amorphous silicon film layer, the step S1 further comprises: doping the amorphous silicon film layer so as to darken the color of the amorphous silicon film layer.

For example, the method also comprises, before or after the step S1, a step of forming an indium tin oxide film layer and performing atomization of the indium tin oxide film layer.

For example, the method further comprises step S3: performing a patterning process of the anti-reflective film layer, the indium tin oxide film layer and the metal conductive film layer, so as to form a pattern including the metal conductive layer, the anti-reflective layer and the indium tin oxide layer.

The present disclosure also provides an array substrate prepared by the above-described preparation method, which comprises a substrate, a metal conductive layer and an anti-reflective layer located between the substrate and the metal conductive layer. Due to the sand-like granulation structure of the anti-reflective layer, the light reflected from the metal conductive layer towards the substrate can be prevented.

For example, the anti-reflective layer and the metal conductive layer are overlapped completely, and the anti-reflective layer comprises a silicon nitride layer and/or an amorphous silicon layer.

For example, the anti-reflective layer further comprises an atomized indium tin oxide layer, which may be located between the anti-reflective layer and the metal conductive layer or between the anti-reflective layer and the substrate.

The present disclosure also provides a display device comprising the above-described array substrate.

For example, the display device further comprises a color filter substrate and back light, wherein the array substrate and the color filter substrate are aligned, and the back light is set on the side of the color filter substrate away from the array substrate.

The present disclosure has the following advantages: in the method for manufacturing an array substrate provided by the present disclosure, an anti-reflective film layer is formed by adjusting the reaction power and/or reactive gas flow during film forming, the anti-reflective film layer can generate a sand-like granulation structure, which causes the anti-reflective film layer uneven and rough, thus the light irradiated thereon from outside would unlikely pass through and could scatter, thereby preventing or reducing the occurrence of transmission and mirror reflection of light irradiated thereon. Therefore, not only most light irradiated on the surface of the metal conductive film layer can be blocked, but also mirror reflection of the light irradiated on the surface of the metal conductive film layer can be decreased. Moreover, the effect on the display of the array substrate caused by the light reflected on the surface of the metal conductive film layer would be weakened or avoided, further improving the display effect of the display panel comprising the array substrate.

REFERENCES

1. substrate; 2. anti-reflective film layer; 3. metal conductive film layer; 4. metal conductive layer; 5. anti-reflective film layer; 51. silicon nitride film layer; 52. amorphous silicon film layer; 6. atomized indium tin oxide film layer.

DETAILED DESCRIPTION OF EMBODIMENTS

The present disclosure provides an array substrate and a method for manufacturing the same as well as a display device in order to solve the above technical problem present in the prior art. The array substrate comprises a substrate, a metal conductive film layer, and an anti-reflective film layer which is located between the substrate and the metal conductive film layer.

Herein, the term "sand-like granulation structure" refers to, an uneven structure like sand grain in the thin film formed by using a chemical vapor deposition process, which is produced due to the film formation abnormity caused by the sudden change of parameters such as electrical source power, gas flow and the like during the film formation.

The array substrate and the method for manufacturing the same, and the display device provided in the present disclosure will be described in detail with reference to the accompanying drawings and specific embodiments in order to provide a better understanding of the technical solutions of the present disclosure for those skilled in the art.

Figure 1:
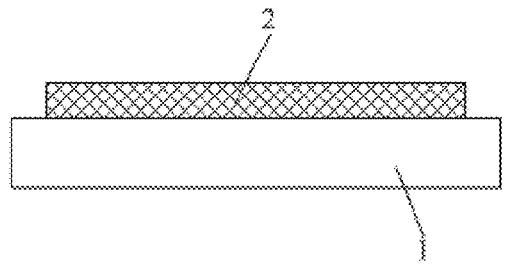
FIG. 1 is a schematic view of step S1 of the method for manufacturing an array substrate according to an embodiment of the present disclosure.
Figure 2:
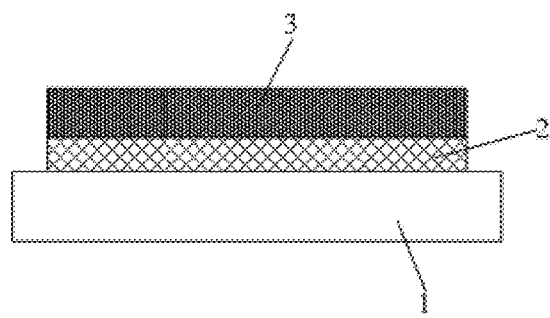
FIG. 2 is a schematic view of step S2 of the method for manufacturing an array substrate according to an embodiment of the present disclosure.

In one embodiment, the present disclosure provides a method for manufacturing an array substrate, as shown in FIGS. 1 and 2, comprising:

step S1: forming an anti-reflective film layer 2 on a substrate 1 by adjusting the reaction power during the film formation during chemical vapor deposition process, as shown in FIG. 1.

This step includes a first stage and a second stage, in which the first stage and the second stage are carried out continuously, and the reaction power of the first stage is higher than that of the second stage by 50% or more, and alternatively the reaction power of the first stage is lower than that of the second stage by 50% or more. For example, the first stage is within 1 to 3 seconds from the beginning of the deposition of the anti-reflective film layer 2.

The specific process of this step is as below: within 1 to 3 seconds from the beginning of the deposition of the anti-reflective film layer 2, the reaction power is adjusted to the reaction power of the first stage; then the reaction power is changed to the reaction power of the second stage as the deposition of the anti-reflective film layer 2 continues until the deposition of the anti-reflective film layer 2 is completed.

Figure 3:
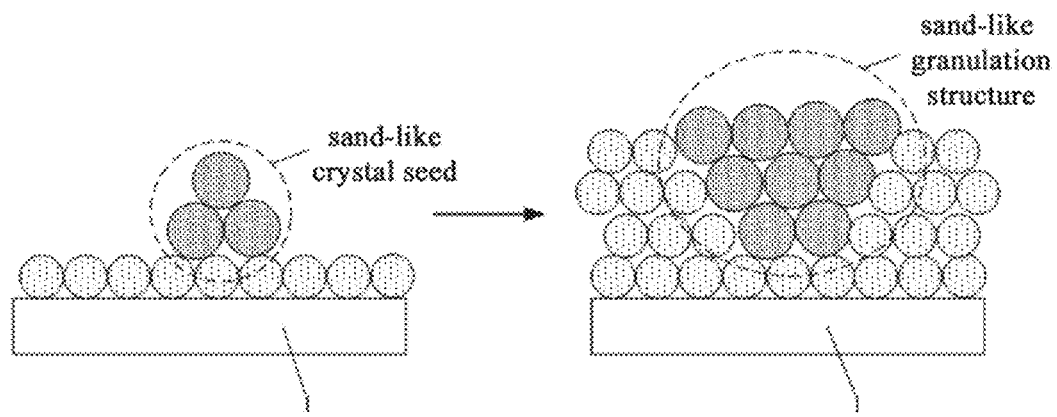
FIG. 3 are schematic views of sand-like granulation structure formed on the basis of the generated sand-like crystal seeds during the deposition of anti-reflective film layer on the substrate in the step S1 according to an embodiment of the present disclosure.
Figure 4:
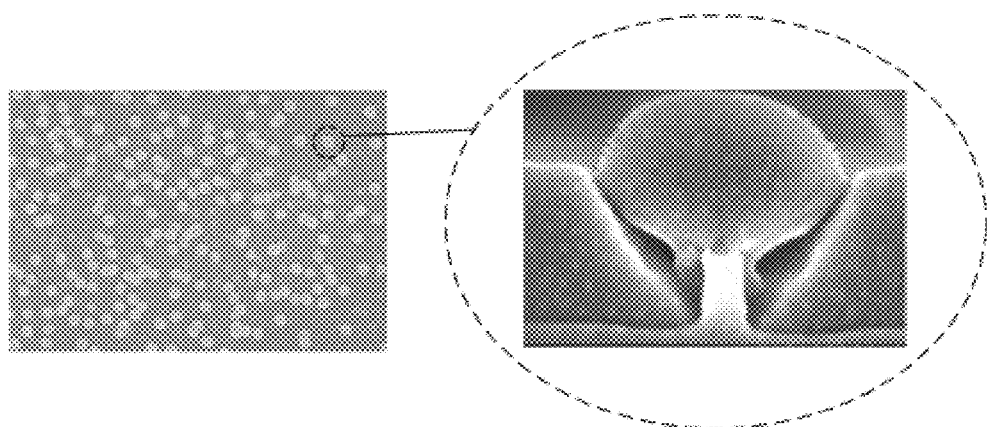
FIG. 4 is a schematic view showing the microcosmic morphology and an enlarged view showing the local morphology of the anti-reflective film layer according to an embodiment of the present disclosure, respectively.

In the present embodiment, the anti-reflective film layer 2 is a silicon nitride film layer. Taking the silicon nitride film layer formed by 8.5 G producing line enhanced chemical vapor deposition process by using 55KS-type equipment manufactured by AKT as an example, the thickness of the anti-reflective film layer 2 is about 700 Å-750 Å. In the process, a silicon nitride film layer with a thickness of about 750 Å is deposited on the substrate, the reaction power is 22 kw and the pressure is 1500 mT in the second stage, and the reaction power is decreased (or increased) suddenly from 22 kw to 50 kw (i.e. the reaction power of the first stage) within 1 to 3 seconds from the beginning of film formation, then the reaction power is increased (or decreased) suddenly to the normal value 22 kw (i.e. the reaction power of the second stage). The sudden decrease or increase of the reaction power would cause the generation of sand-like crystal seeds on the interface of the silicon nitride film layer and the substrate. After the reaction power comes back to a stable value, the sand-like crystal seeds continue to grow to form bumps like the sand grains, and in other places except the bumps, a normal silicon nitride layer is formed (as shown in FIGS. 3 and 4). Because there are many uncertain defects in the interior and cross section of the "sand grains", light irradiated from outside thereon would be partially absorbed, and some light would scatter. Meanwhile, the silicon nitride film layer would become uneven and have a high roughness due to the presence of the "sand grains". Therefore, the silicon nitride film layer can play a role of preventing or reducing the occurrence of transmission and mirror reflection of light irradiated thereon.

It should be noted that, during the deposition process of the anti-reflective film layer 2, the reaction power of the first stage could be set in the intermediate period or the end period of the deposition process, but the sand-like granulation effect of the anti-reflective film layer 2 is poorer in comparison with the effect when the reaction power of the first stage is set in the initial period of the deposition process. So it is preferable that the reaction power of the first stage is set within 1 to 3 seconds from the beginning of the deposition of the anti-reflective film layer 2.

step S2: forming a metal conductive film layer 3 on the anti-reflective film layer 2 (as shown in FIG. 2). The anti-reflective film layer 2 could block the light reflected from the surface of the metal conductive film layer 3.

In this step, the metal conductive film layer 3 is formed using the sputtering deposition process, which will not be described in detail.

Because the silicon nitride film layer is uneven and has a high roughness, only a little part of the light that pass through the silicon nitride film layer can be transmitted to the surface of the metal conductive film layer 3, and diffusing reflection rather than mirror reflection of the little part of the light transmitted to the surface of the metal conductive film layer 3 would occur, thereby not only blocking most light irradiated on the surface of the metal conductive film layer 3 but also impairing the effect of mirror reflection by the little part of light irradiated on the surface of the metal conductive film layer 3. Therefore, the effect on the display of the array substrate caused by the light reflected on the surface of the metal conductive film layer 3 would be weakened or avoided, further improving the display effect.

In the present embodiment, the method for manufacturing an array substrate also comprises step S3: performing a single patterning process of the anti-reflective film layer 2 and the metal conductive film layer 3, so as to form a pattern including the metal conductive layer and the anti-reflective layer, wherein the patterning process includes photoresist coating, exposure, development, etching, photoresist stripping and the like.

In this step, through the single patterning process of the anti-reflective film layer 2 and the metal conductive film layer 3, the patterns of the metal conductive layer and the anti-reflective layer thus formed can be aligned accurately, so as to ensure the yield of the array substrate. In addition, the anti-reflective film layer 2 is subjected to dry etching so as to form a pattern of the anti-reflective film layer, and the metal conductive film layer 3 is subjected to wet etching so as to form a pattern of the metal conductive film layer. The specific dry etching process and wet etching process would not be described herein any more.

The reflectivity to the broad spectrum visible light of the array substrate comprising a anti-reflective film layer obtained from the above embodiment measured by spectrophotometer LCF-2100A-SF (from Otsuka Electronics) is just 18%, which is remarkably lower than the reflectivity (generally 50%) of the metal conductive film layer without a anti-reflective film layer.

It should be further noted that, the anti-reflective film layer 2 can also be an amorphous silicon film layer. The thickness of the amorphous silicon film layer is about 350 Å. In the process, an amorphous silicon film layer with a thickness of about 350 Å is deposited on the substrate, the reaction power is 12 kw and the pressure is 2500 mT in the second stage, and the reaction power is decreased (or increased) suddenly within 1 to 3 seconds from the beginning of film formation, wherein the extent of the sudden decrease or increase is the same as that in the case of the above silicon nitride film layer. The sudden decrease or increase of the reaction power would cause the sand-like granulation of the amorphous silicon film layer during the film formation, thereby playing a role of preventing or reducing the occurrence of transmission and mirror reflection of light irradiated thereon.

In addition, when forming the amorphous silicon film layer, the step S1 further comprises doping the amorphous silicon film layer so as to darken the color of the amorphous silicon film layer. For example, the doping of phosphorous can be carried out to the above amorphous silicon film layer. During the formation of the amorphous silicon film layer by chemical vapor process, $PH_3$ gas is introduced in the flow of 5000-30000 sccm to perform the doping of phosphorous during the deposition of the amorphous silicon film layer. The color of the doped amorphous silicon film layer is darkened, so the amount of light transmitted from the anti-reflected film layer 2 can be further reduced, the amount of light irradiated on the metal conductive film layer 3 through the anti-reflected film layer 2 can be further reduced, and the reflection amount of light irradiated on the metal conductive film layer 3, thereby ensuring the normal display of the array substrate.

Of course, the anti-reflected film layer 2 of the present embodiment can also comprise a silicon nitride film layer and an amorphous silicon film layer, that is to say, the anti-reflected film layer 2 comprises two film layers, wherein the reaction power during the preparation of said two film layers can be set as above, the order of deposition of the two film layers can be set arbitrarily, and the two film layers can be formed by single exposure and dry etching process, thus saving the process steps. Moreover, by providing the silicon nitride film layer and the amorphous silicon film layer simultaneously, the effect on the display of the array substrate caused by the light reflected on the surface of the metal conductive film layer 3 could be further weakened or avoided, further improving the display effect.

Furthermore, because the silicon nitride material and the amorphous silicon material are common, and the manufacture process of the silicon nitride film layer and the amorphous silicon film layer is relatively mature, such film layers can be manufactured in almost all product line of the liquid crystal display, the equipment and materials have no need of change, and the manufacture chamber would not be polluted. Therefore, they are suitable to be used to prepare the anti-reflected film layer 2.

Figure 5:
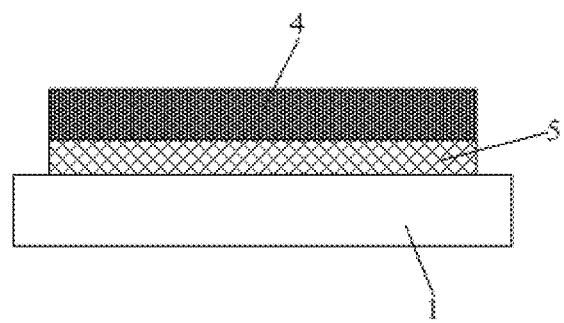
FIG. 5 is a sectional view showing one structure of the array substrate according to an embodiment of the present disclosure.

As shown in FIG. 5, the array substrate manufactured by the above method comprises a substrate 1, a metal conductive layer 4 and an anti-reflective layer 5 between the substrate 1 and the metal conductive layer 4, wherein the anti-reflective layer 5 has a sand-like granulation structure, thereby blocking the light reflected from the metal conductive layer 4 towards the substrate 1.

In the present embodiment, the metal conductive layer 4 and the anti-reflective layer 5 are overlapped completely. In this way, the aperture ratio of the array substrate is large. The anti-reflective layer 5 is silicon nitride layer. It should be noted that, the anti-reflective layer 5 can also be amorphous silicon layer. In addition, the anti-reflective layer 5 and the metal conductive layer 4 may not be overlapped completely, as long as the anti-reflective layer 5 can completely shield the metal conductive layer 4.

Figure 6:
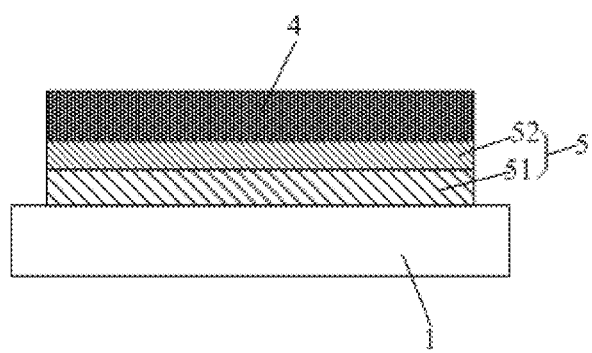
FIG. 6 is a sectional view showing another structure of the array substrate according to an embodiment of the present disclosure.

Furthermore, as shown in FIG. 6, the anti-reflective layer 5 in the present embodiment can also comprise a silicon nitride layer 51 and an amorphous silicon layer 52. The metal conductive layer 4 is overlapped the silicon nitride layer 51 and the amorphous silicon layer 52 completely, and the position of the silicon nitride layer 51 and the position of the amorphous silicon layer 52 can be exchanged with each other. Certainly, the metal conductive layer 4 may not coincide with the silicon nitride layer 51 and the amorphous silicon layer 52 completely, as long as the silicon nitride layer 51 and the amorphous silicon layer 52 can shield the metal conductive layer 4.

Another embodiment of the present disclosure provides a method for manufacturing an array substrate, which is different from the above embodiment in that, in the step S1, the anti-reflective film layer is formed on the substrate by adjusting the reactive gas flow during the film formation by using the chemical vapor deposition process.

Accordingly, this step includes a first stage and a second stage, in which the first stage and the second stage are carried out continuously, and the reactive gas flow of the first stage is higher than that of the second stage by 20% or more, and alternatively the reactive gas flow of the first stage is lower than that of the second stage by 50% or more. For example, the first stage is within 1 to 3 seconds from the beginning of the deposition of the anti-reflective film layer.

The specific process of this step is as below: within 1 to 3 seconds from the beginning of the deposition of the anti-reflective film layer, the reactive gas flow is adjusted to the reactive gas flow of the first stage, that is to say, the reactive gas flow of the second stage is raised by 20% or more, or the reactive gas flow of the second stage is lowered by 50% or more; then the reactive gas flow of the first stage is changed to the reactive gas flow of the second stage and the deposition of the anti-reflective film layer continues until the completion of the deposition of the anti-reflective film layer.

The above adjustment process of reactive gas flow will be illustrated by using a silicon nitride film layer as the anti-reflective film layer: taking the silicon nitride film layer which is formed by 8.5 G producing line enhanced chemical vapor deposition process using 55KS-type equipment manufactured by AKT as an example, $SiH_4$, $NH_3$ and $N_2$ gases are introduced during the film formation, wherein the flow of $SiH_4$ is 6000 sccm, the flow of $NH_3$ in the second stage is 25000 sccm, and the flow of $N_2$ in the second stage is 55000 sccm. Within 1 to 3 seconds from the beginning of the film formation, excess $NH_3$ or $N_2$ is introduced, for example, the flow of $NH_3$ in the first stage can be up to 30000-50000 sccm, and the flow of $N_2$ in the first stage can be up to 70000-80000 sccm; then the flow suddenly change to the flow of the second stage. As a result, a silicon nitride film layer having the same sand-like granulation structure as the silicon nitride film layer of the above embodiment can be obtained.

Similar as the aforesaid embodiment, the array substrate comprising the anti-reflective film layer according to the present embodiment has a reflectivity for board spectrum visible light of about 20%, which is remarkably lower than the reflectivity (generally 50%) of the metal conductive film layer without a anti-reflective film layer.

It should be noted that, the anti-reflective film layer of the present embodiment can also be an amorphous silicon film layer. Specifically, $SiH_4$ and $H_2$ gases are introduced during the film formation. The flow of $SiH_4$ is 12000 sccm, and the flow of $H_2$ in the second stage is 40000 sccm. Within 1 to 3 seconds from the beginning of the film formation, the flow of $H_2$ is decreased or increased suddenly, wherein the extent of the sudden decrease or increase is the same as that in the case of the above silicon nitride film layer. The sudden decrease or increase of the reactive gas flow could obtain an amorphous silicon film layer having the same sand-like granulation structure as the amorphous silicon film layer of the above embodiment.

In the present embodiment, the time period during which the reactive gas flow is abruptly changed, the film layer configuration of the anti-reflective film layer and the other steps in the formation process of the anti-reflective film layer are the same with those in the above embodiment, which would not be described in details.

It should be further noted that, during the film formation of the anti-reflective film layer, the reaction power and the reactive gas flow in the film formation can be adjusted simultaneously, by which the anti-reflective film layer with a sand-like granulation structure can also be formed. The adjustment of the reaction power and the reactive gas flow is the same with that in the above embodiment, which will not be described in detail.

Figure 7:
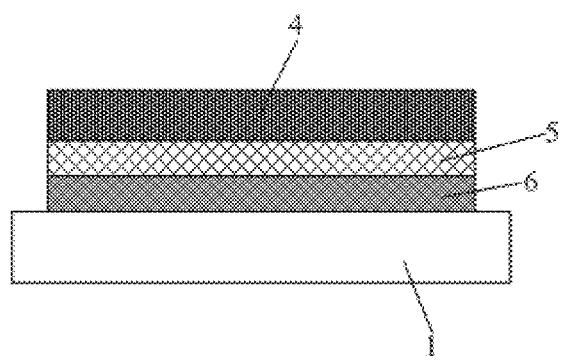
FIG. 7 is a structure sectional view of the array substrate according to an embodiment of the present disclosure.

As shown in FIG. 7, another embodiment of the present disclosure provides an array substrate, which comprises, in addition to the above substrate, metal conductive layer and anti-reflective layer, an atomized indium tin oxide layer 6. The atomized indium tin oxide layer 6 may be disposed between the anti-reflective layer 5 and the substrate 1, or may be disposed between the anti-reflective layer 5 and the metal conductive layer 4.

Accordingly, different from the above embodiment, the manufacture method of the array substrate further comprises a step of forming an indium tin oxide film layer and performing atomization of the indium tin oxide film layer before or after the step S1.

The indium tin oxide film layer can be formed by using the chemical vapor deposition process or the sputtering deposition process, which will not be described in details. The atomization can be performed after the film formation of the indium tin oxide film layer. For example, the specific atomization process is as below: hydrogen gas is introduced into the film-forming chamber, and hydrogen gas is ionized to generate plasma, which will impact the surface of the indium tin oxide film layer, thereby conducting atomization of the surface of the indium tin oxide film layer.

The manufacture method of the present embodiment further comprises step S3: performing single patterning process of the anti-reflective film layer, the indium tin oxide film layer and the metal conductive film layer, so as to form a pattern including the metal conductive layer, the anti-reflective layer and the indium tin oxide layer. That is to say, the anti-reflective film layer, the indium tin oxide film layer and the metal conductive film layer can be formed by one patterning process, which could make the patterns, formed after the completion of the patterning, of the metal conductive layer, the indium tin oxide layer and the anti-reflective layer can be aligned accurately, so as to ensure the yield of the array substrate. The patterning process includes photoresist coating, exposure, development, etching, photoresist stripping and the like. In addition, the anti-reflective film layer is subjected to dry etching so as to form a pattern of the anti-reflective layer. The metal conductive film layer and the indium tin oxide film layer are subjected to wet etching so as to form patterns of the metal conductive layer and the indium tin oxide layer. If the indium tin oxide film layer is to be formed after the step S1, the indium tin oxide film layer and the metal conductive film layer can be formed by one wet etching process, thus saving the process steps. The specific dry etching process and wet etching process would not be described in details herein.

Another embodiment of the present disclosure provides a display device comprising the array substrate as described in the above embodiment.

The display device in the present embodiment is such a display device that the array substrate is outward (i.e. towards the viewer), which can realize the effect of narrow border.

Said display device can be a liquid crystal display device, a liquid crystal display device with a touch function or an OLED display device. The display device provided by the present disclosure could be any product or component having a display function such as liquid crystal panel, OLED panel, liquid crystal TV, OLED TV, display, mobile phone, navigator and so on.

The display device can further comprise a color filter substrate and back light, wherein the array substrate and the color filter substrate are arranged as aligned, and the back light is set on the side of the color filter substrate away from the array substrate. That is, said display device is a liquid crystal display device.

By use of the array substrate of any one of the aforesaid embodiments, the reflection of outside light by the metal conductive layer (such as metal electrode wire) on the array substrate which is disposed outward can be prevented, thereby weakening or avoiding the effect on the normal display of the display device caused by the light reflection of the metal conductive layer, further improving the display effect of the display device.

It should be understood that the embodiments described above are merely the exemplary embodiments for the purpose of illustrating the principles of the present disclosure, which shall not limit the scope of the invention. Various changes and modifications to the present disclosure made without departing from the scope and spirit of invention by a person skilled in the art should all be covered in the protection scope of the present invention.

The invention claimed is:

1. A method for manufacturing an array substrate, characterized by comprising:
    step S1: forming an anti-reflective film layer on a substrate, wherein the anti-reflective film layer has a sand-like granulation structure by adjusting the reaction power and/or reactive gas flow during the chemical vapor deposition process; and
    step S2: forming a metal conductive film layer on the anti-reflective film layer.

2. The method for manufacturing an array substrate according to claim 1, characterized in that, the step "forming an anti-reflective film layer on a substrate by adjusting the reaction power during the chemical vapor deposition process" includes a first stage and a second stage, in which the first stage and the second stage are carried out continuously, and the reaction power of the first stage is higher than that of the second stage by 50% or more, and alternatively the reaction power of the first stage is lower than that of the second stage by 50% or more.

3. The method for manufacturing an array substrate according to claim 1, characterized in that, the step "forming an anti-reflective film layer on a substrate by adjusting the reactive gas flow during the chemical vapor deposition process" includes a first stage and a second stage, in which the first stage and the second stage are carried out continuously, and the reactive gas flow of the first stage is higher than that of the second stage by 20% or more, and alternatively the reactive gas flow of the first stage is lower than that of the second stage by 50% or more.

4. The method for manufacturing an array substrate according to claim 2, characterized in that, the first stage is within 1 to 3 seconds from the beginning of the deposition of the anti-reflective film layer.

5. The method for manufacturing an array substrate according to claim 3, characterized in that, the first stage is within 1 to 3 seconds from the beginning of the deposition of the anti-reflective film layer.

6. The method for manufacturing an array substrate according to claim 1, characterized in that, the anti-reflective film layer comprises a silicon nitride film layer an amorphous silicon film layer.

7. The method for manufacturing an array substrate according to claim 6, characterized in that, when forming the amorphous silicon film layer, the step S1 further comprises: doping the amorphous silicon film layer so as to darken the color of the amorphous silicon film layer.

8. The method for manufacturing an array substrate according to claim 1, characterized in that, it further comprises a step of forming an indium tin oxide film layer and performing atomization of the indium tin oxide film layer before or after the step S1.

9. The method for manufacturing an array substrate according to claim 8, characterized in that, it further comprises S3: performing a patterning process of the anti-reflective film layer, the indium tin oxide film layer and the metal conductive film layer, so as to form a pattern including the metal conductive layer, the anti-reflective layer and the indium tin oxide layer.

10. An array substrate manufactured by the method according to claim 1, comprising a substrate and a metal conductive layer, characterized in that, it further comprises an anti-reflective layer located between the substrate and the metal conductive layer, and the anti-reflective layer has a plurality of sand-like granulation structures.

11. The array substrate according to claim 10, characterized in that, the anti-reflective layer and the metal conductive layer are overlapped completely, and the anti-reflective layer comprises a silicon nitride layer or an amorphous silicon layer.

12. The array substrate according to claim 11, characterized in that, it further comprises an atomized indium tin oxide layer, which is located between the anti-reflective layer and the metal conductive layer or between the anti-reflective layer and the substrate.

13. A display device, characterized by comprising the array substrate according to claim 10.

14. The display device according to claim 13, characterized in that, it further comprises a color filter substrate and back light, wherein the array substrate and the color filter substrate are aligned, and the back light is set on the side of the color filter substrate away from the array substrate.

15. The method for manufacturing an array substrate according to claim 1, characterized in that, the anti-reflective film layer comprises a silicon nitride film layer and an amorphous silicon film layer.

16. The array substrate according to claim 10, characterized in that, the anti-reflective layer and the metal conductive layer are overlapped completely, and the anti-reflective layer comprises a silicon nitride layer and an amorphous silicon layer.

* * * * *